United States Patent
Suzuki et al.

(10) Patent No.: US 11,881,504 B2
(45) Date of Patent: Jan. 23, 2024

(54) SEMICONDUCTOR DEVICE AND MANUFACTURING METHOD THEREFOR

(71) Applicant: Mitsubishi Electric Corporation, Tokyo (JP)

(72) Inventors: Kenji Suzuki, Tokyo (JP); Yuki Haraguchi, Tokyo (JP); Haruhiko Minamitake, Tokyo (JP); Taiki Hoshi, Tokyo (JP); Takuya Yoshida, Fukuoka (JP); Hidenori Koketsu, Tokyo (JP); Yusuke Miyata, Tokyo (JP); Akira Kiyoi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 137 days.

(21) Appl. No.: 17/472,992

(22) Filed: Sep. 13, 2021

(65) Prior Publication Data

US 2022/0181435 A1 Jun. 9, 2022

(30) Foreign Application Priority Data

Dec. 7, 2020 (JP) .................................. 2020-202468

(51) Int. Cl.
*H01L 29/06* (2006.01)
*H01L 29/739* (2006.01)
(Continued)

(52) U.S. Cl.
CPC .... *H01L 29/0607* (2013.01); *H01L 29/66348* (2013.01); *H01L 29/7397* (2013.01); *H01L 27/0629* (2013.01)

(58) Field of Classification Search
CPC ............. H01L 29/0607; H01L 29/7397; H01L 27/0629; H01L 29/0619; H01L 29/32;
(Continued)

(56) References Cited

U.S. PATENT DOCUMENTS

| 2014/0374882 A1 | 12/2014 | Siemieniec et al. |
| 2015/0031175 A1 | 1/2015 | Teranishi et al. |

(Continued)

FOREIGN PATENT DOCUMENTS

| JP | 2015-005688 A | 1/2015 |
| JP | 2016-111337 A | 6/2016 |

(Continued)

OTHER PUBLICATIONS

An Office Action; "Notice of Reasons for Refusal," mailed by the Japanese Patent Office dated Nov. 28, 2023, which corresponds to Japanese Patent Application No. 2020-202468 and is related to U.S. Appl. No. 17/472,992; with English language translation.

*Primary Examiner* — Shahed Ahmed
(74) *Attorney, Agent, or Firm* — Studebaker & Brackett PC

(57) ABSTRACT

A semiconductor device according to the present disclosure includes: a first conductivity-type silicon substrate including a cell part and a termination part surrounding the cell part in plan view; a first conductivity-type emitter layer provided on a front surface of the silicon substrate in the cell part; a second conductivity-type collector layer provided on a back surface of the silicon substrate in the cell part; a first conductivity-type drift layer provided between the emitter layer and the collector layer; a trench gate provided to reach the drift layer from a front surface of the emitter layer; and a second conductivity-type well layer provided on the front surface of the silicon substrate in the termination part. Vacancies included in a crystal defect in the cell part are less than vacancies included in a crystal defect in the termination part.

7 Claims, 16 Drawing Sheets

(51) Int. Cl.
*H01L 29/66* (2006.01)
*H01L 27/06* (2006.01)

(58) Field of Classification Search
CPC ............. H01L 29/0611; H01L 29/7396; H01L 29/66325–66348; H01L 29/7393–7398; H01L 29/083–0839; H01L 21/322–3228
See application file for complete search history.

(56) References Cited

U.S. PATENT DOCUMENTS

| | | | |
|---|---|---|---|
| 2016/0104622 | A1 | 4/2016 | Oefner et al. |
| 2019/0206860 | A1* | 7/2019 | Kamimura ........ H01L 29/66348 |
| 2019/0287961 | A1* | 9/2019 | Naito .................. H01L 27/0727 |
| 2020/0058506 | A1 | 2/2020 | Nakamura |
| 2021/0126092 | A1* | 4/2021 | Kubouchi ........... H01L 29/0834 |

FOREIGN PATENT DOCUMENTS

| | | |
|---|---|---|
| JP | 2019-062189 A | 4/2019 |
| JP | 2020-027921 A | 2/2020 |
| WO | 2013/180244 A1 | 12/2013 |

* cited by examiner

SEMICONDUCTOR DEVICE AND MANUFACTURING METHOD THEREFOR

BACKGROUND OF THE INVENTION

Field of the Invention

The present disclosure relates to a semiconductor device and a manufacturing method therefor.

Description of the Background Art

When wafers used for power semiconductors, such as an insulated gate bipolar transistor (IGBT) and a diode, have a size of 6 inches or 8 inches, the wafers are mainly manufactured with a floating zone (FZ) method. Meanwhile, the diameter of the wafers has been increasing in order to directly reduce material costs and wafer process costs. For example, 12-inch wafers are mainly manufactured with a magnetic field applied Czochralski (MCZ) method. The wafers manufactured with the MCZ method have oxygen concentration included in the wafers higher than the wafers manufactured with the FZ method. The oxygen concentration relates to crystal defects such as crystal originated particles (COPs), and there is a problem that a gate breakdown voltage reduces due to a crystal defect caused due to oxygen. Thus, in order to enhance the gate breakdown voltage, it is desirable that the oxygen concentration included in the wafer be reduced.

As a method of reducing oxygen concentration included in a wafer manufactured with the MCZ method, the following technology has hitherto been disclosed: a carrier wafer is caused to adhere to a device wafer, and oxygen is diffused from the device wafer to the carrier wafer during any beneficial thermal treatment, in such a manner that oxygen concentration in the device wafer is maintained low (for example, see Japanese Patent Application Laid-Open No. 2016-111337).

The technology of Japanese Patent Application Laid-Open No. 2016-111337 has a problem in that the carrier wafer is required other than the device wafer, and the number of processes and costs required for maintaining oxygen concentration in the device wafer low are increased. In this manner, the technology of Japanese Patent Application Laid-Open No. 2016-111337 has a problem in that the gate breakdown voltage cannot be easily enhanced.

SUMMARY

The present disclosure has an object to provide a semiconductor device and a manufacturing method therefor that enable easy enhancement of a gate breakdown voltage.

A semiconductor device according to the present disclosure includes: a first conductivity-type silicon substrate including a cell part and a termination part surrounding the cell part in plan view; a first conductivity-type emitter layer provided on a front surface of the silicon substrate in the cell part; a second conductivity-type collector layer provided on a back surface of the silicon substrate in the cell part; a first conductivity-type drift layer provided between the emitter layer and the collector layer; a trench gate provided to reach the drift layer from a front surface of the emitter layer; and a second conductivity-type well layer provided on the front surface of the silicon substrate in the termination part. Vacancies included in a crystal defect in the cell part are less than vacancies included in a crystal defect in the termination part.

According to the present disclosure, vacancies included in the crystal defect in the cell part are less than vacancies included in the crystal defect in the termination part. Therefore, the gate breakdown voltage can be easily enhanced.

These and other objects, features, aspects and advantages of the present disclosure will become more apparent from the following detailed description of the present disclosure when taken in conjunction with the accompanying drawings.

DESCRIPTION OF THE PREFERRED EMBODIMENTS

First Embodiment

<Configuration>

Figure 1:
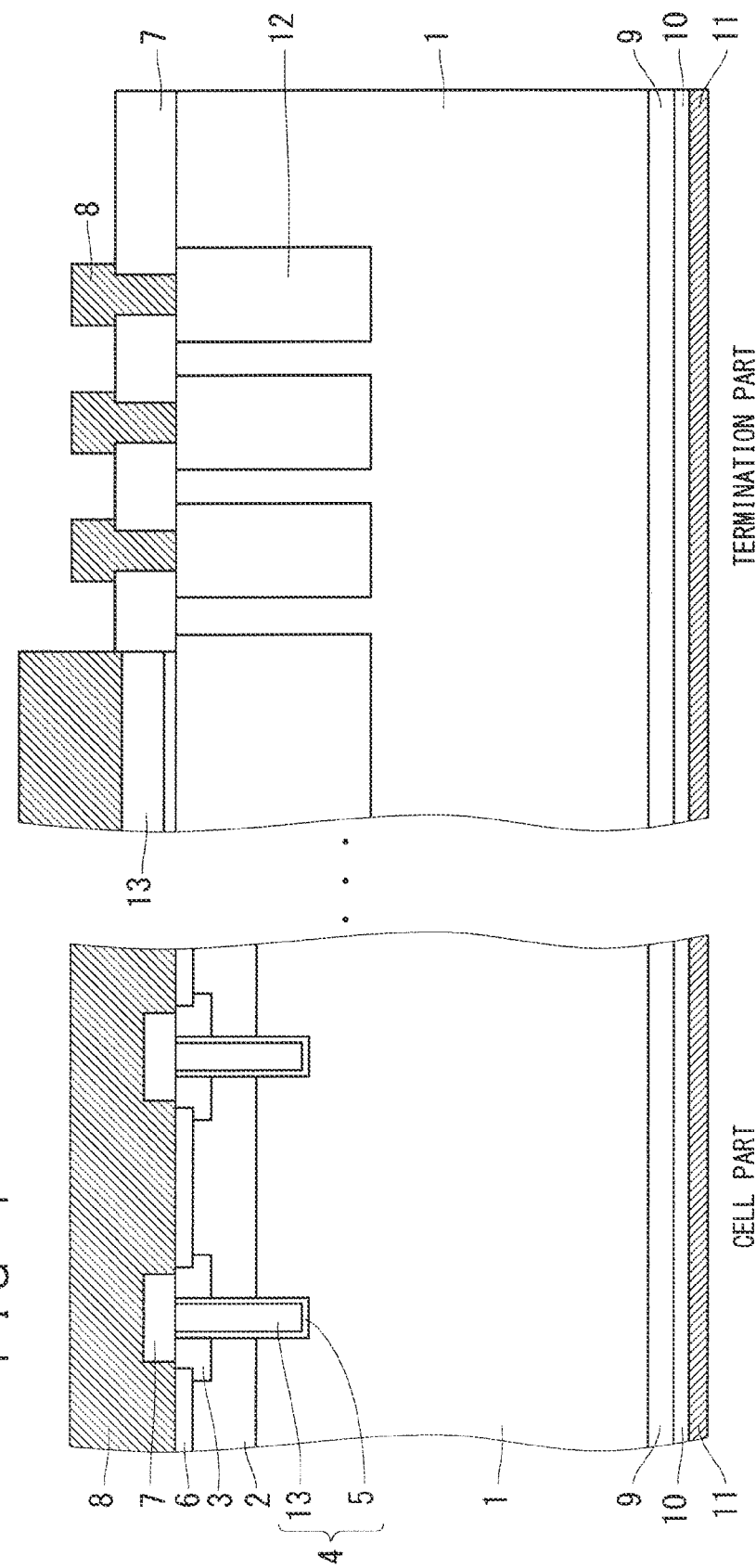
FIG. 1 is a cross-sectional diagram illustrating a configuration of a semiconductor device according to the first embodiment.

FIG. 1 is a cross-sectional diagram illustrating a configuration of a semiconductor device according to the first embodiment. Note that the following description will be given based on the assumption that "n-type" corresponds to "first conductivity-type", and "p-type" corresponds to "second conductivity-type". However, "p-type" may correspond to "first conductivity-type", and "n-type" may correspond to "second conductivity-type". Further, the semiconductor device to be described below is an IGBT.

The semiconductor device according to the first embodiment includes an n-type (first conductivity-type) silicon substrate 1 that includes a cell part and a termination part surrounding the cell part in plan view. The n-type silicon substrate 1 includes an n-type drift layer. In FIG. 1, a layer present between a p base layer 2 and a buffer layer 9 in the cell part corresponds to a drift layer.

The p-type (second conductivity-type) base layer 2 is provided on the front surface side of the n-type silicon substrate 1 in the cell part. Further, an n-type n+ emitter layer 3 and a p-type p+ layer 6 are provided on the most front surface of the n-type silicon substrate 1 in the cell part.

In the cell part, a trench gate 4 is provided to penetrate the n+ emitter layer 3 and the p base layer 2 from the front surface of the n+ emitter layer 3 to reach the drift layer. A gate oxide film 5 is provided on the inner wall of the trench gate 4. Polysilicon 13 is filled in the trench gate 4 via the gate oxide film 5. Further, an interlayer insulation film 7 is provided to cover the front surface of the trench gate 4, and a front surface electrode 8 is provided to cover the n+ emitter layer 3, the p+ layer 6, and the interlayer insulation film 7.

A p-type p well layer 12 is provided on the front surface of the n-type silicon substrate 1 in the termination part. The polysilicon 13 and the interlayer insulation film 7 are provided on the front surface of the p well layer 12. The interlayer insulation film 7 is selectively provided to have openings, and the front surface electrode 8 is provided to fill the openings and have a part thereof come out on the front surface of the interlayer insulation film 7. The front surface electrode 8 is also provided on the polysilicon 13.

The buffer layer 9 and a p-type p collector layer 10 are provided on the back surface of the n-type silicon substrate 1 in the cell part and the termination part. A back surface electrode 11 is provided on the p collector layer 10.

A surface layer of the n-type silicon substrate 1 in the cell part has less vacancies generated due to removal of oxygen included in an inner wall oxide film of a crystal defect than the surface layer in the termination part. The details of the vacancies will be described later.

<Manufacturing Method>

A manufacturing method of the semiconductor device according to the first embodiment will be described with reference to FIGS. 1 to 12.

Figure 2:
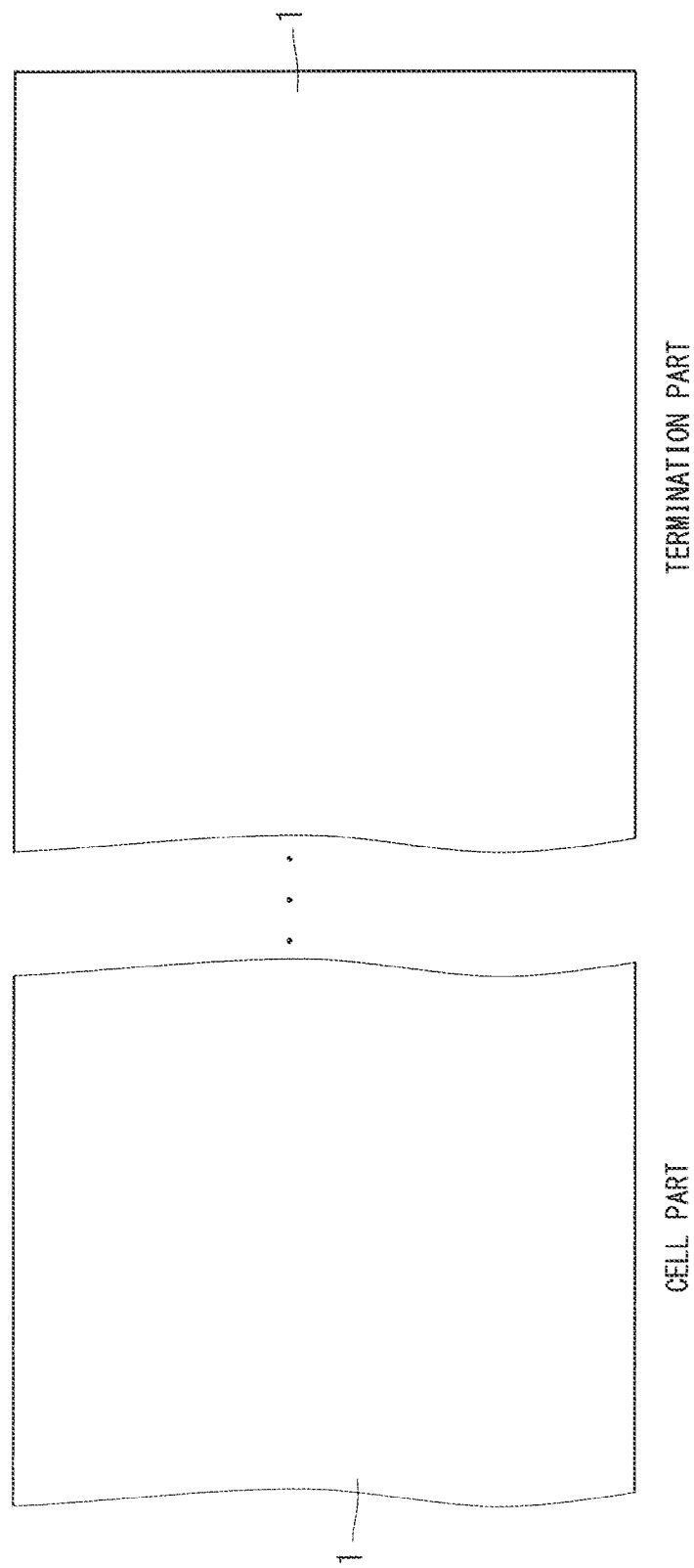
FIG. 2 is a cross-sectional diagram illustrating a manufacturing process of the semiconductor device according to the first embodiment.

First, as illustrated in FIG. 2, the n-type silicon substrate 1 having an n-type drift layer is prepared. The n-type silicon substrate 1 is manufactured by cutting a large-diameter wafer being manufactured with the MCZ method. N-type impurity concentration in the drift layer is determined according to a breakdown voltage of the semiconductor device.

Figure 3:
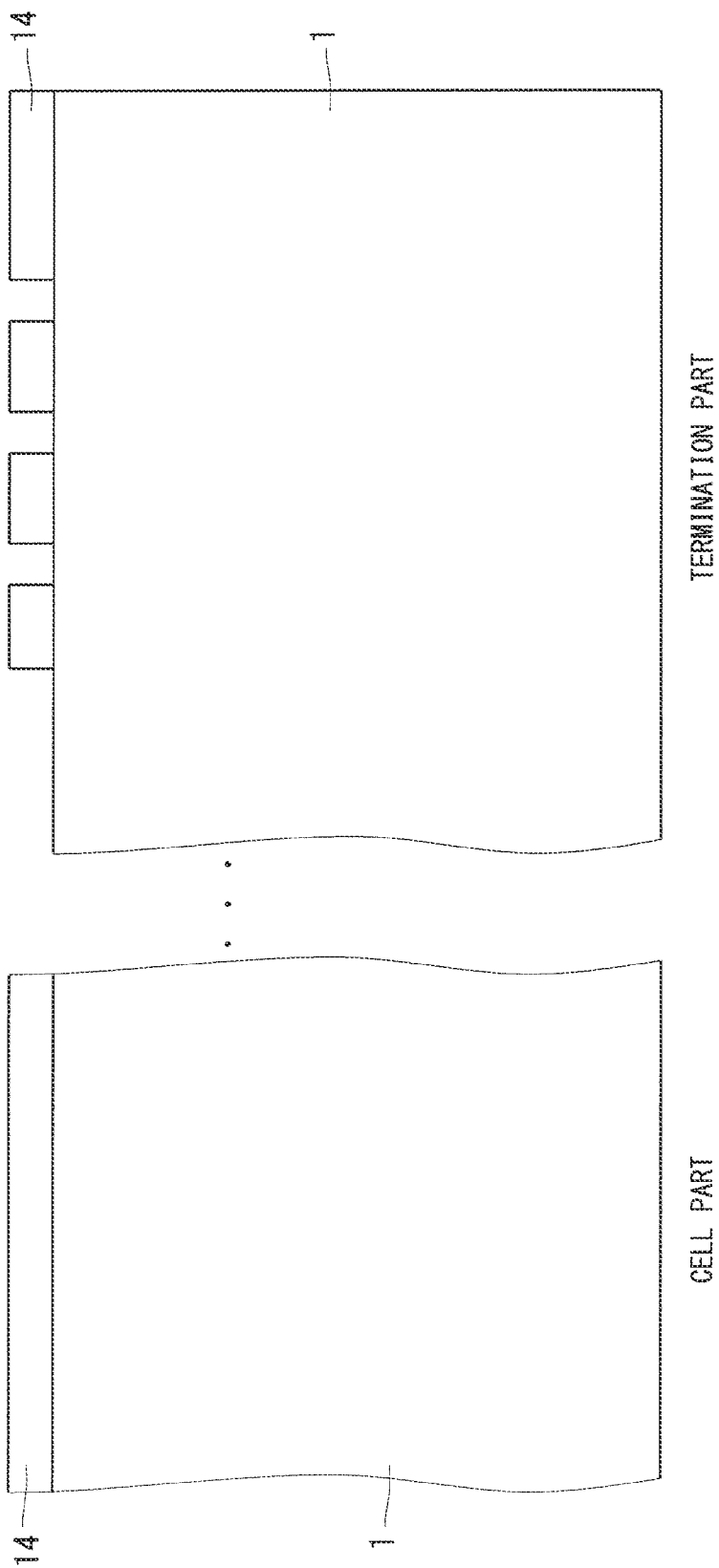
FIG. 3 is a cross-sectional diagram illustrating the manufacturing process of the semiconductor device according to the first embodiment.

Next, as illustrated in FIG. 3, a thick oxide film 14 is formed on the front surface of the n-type silicon substrate 1 in order to form the p well layer 12 on the surface layer of the n-type silicon substrate 1 in the termination part. Specifically, the oxide film 14 is formed on the front surface of the n-type silicon substrate 1, using photolithography. At this time, the oxide film 14 is formed without intervals on the front surface of the n-type silicon substrate 1 in the cell part, and the oxide film 14 is etched on the front surface of the n-type silicon substrate 1 so as to be selectively formed in the termination part. Specifically, in the termination part, the oxide film 14 formed on the front surface of the n-type silicon substrate 1 is formed to have openings. The front surface of the n-type silicon substrate 1 is exposed through the bottom portions of the openings.

Figure 4:
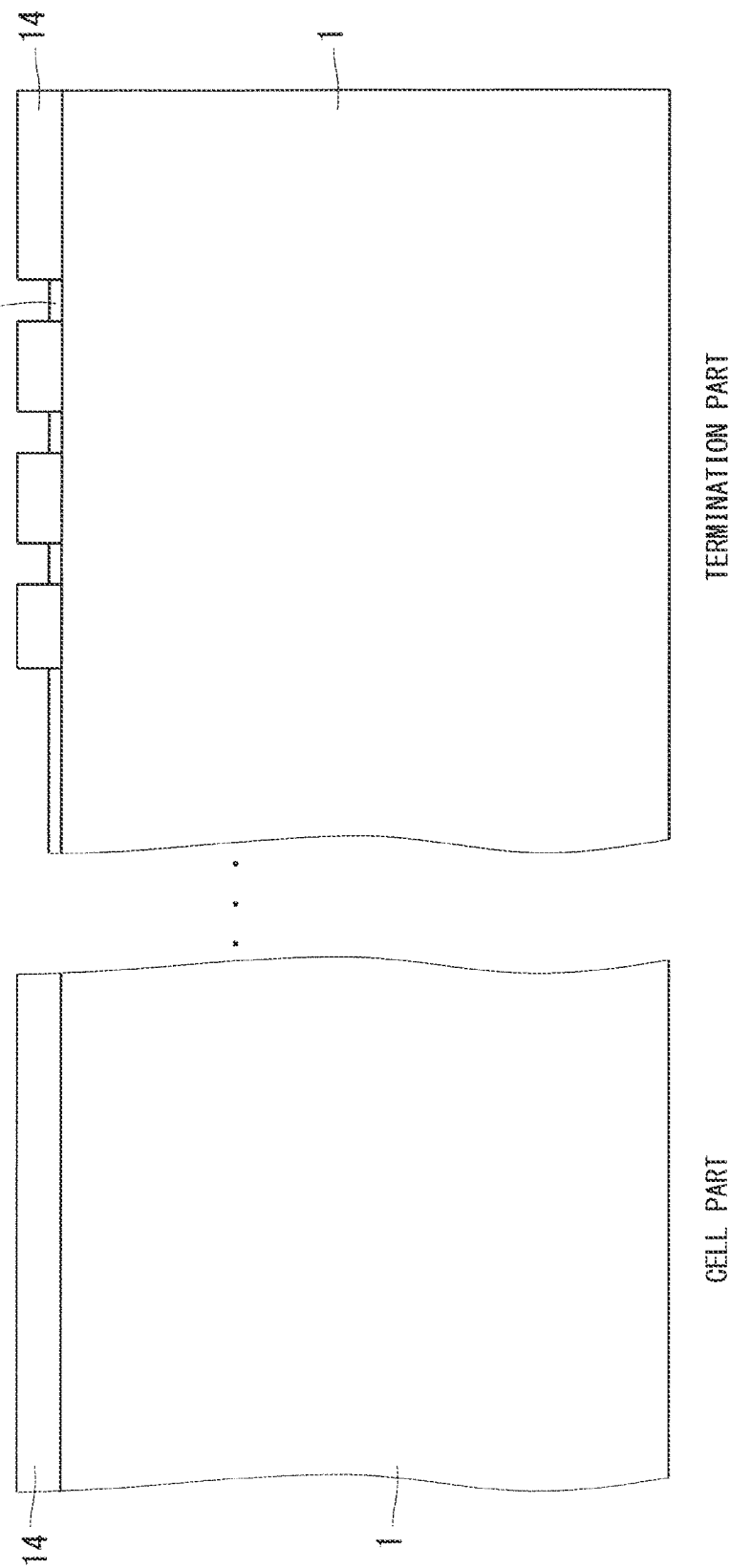
FIG. 4 is a cross-sectional diagram illustrating the manufacturing process of the semiconductor device according to the first embodiment.

Next, as illustrated in FIG. 4, an underlay oxide film 15 is formed to cover the bottom portions of the openings of the oxide film 14 formed on the front surface of the n-type silicon substrate 1 in the termination part.

Figure 5:
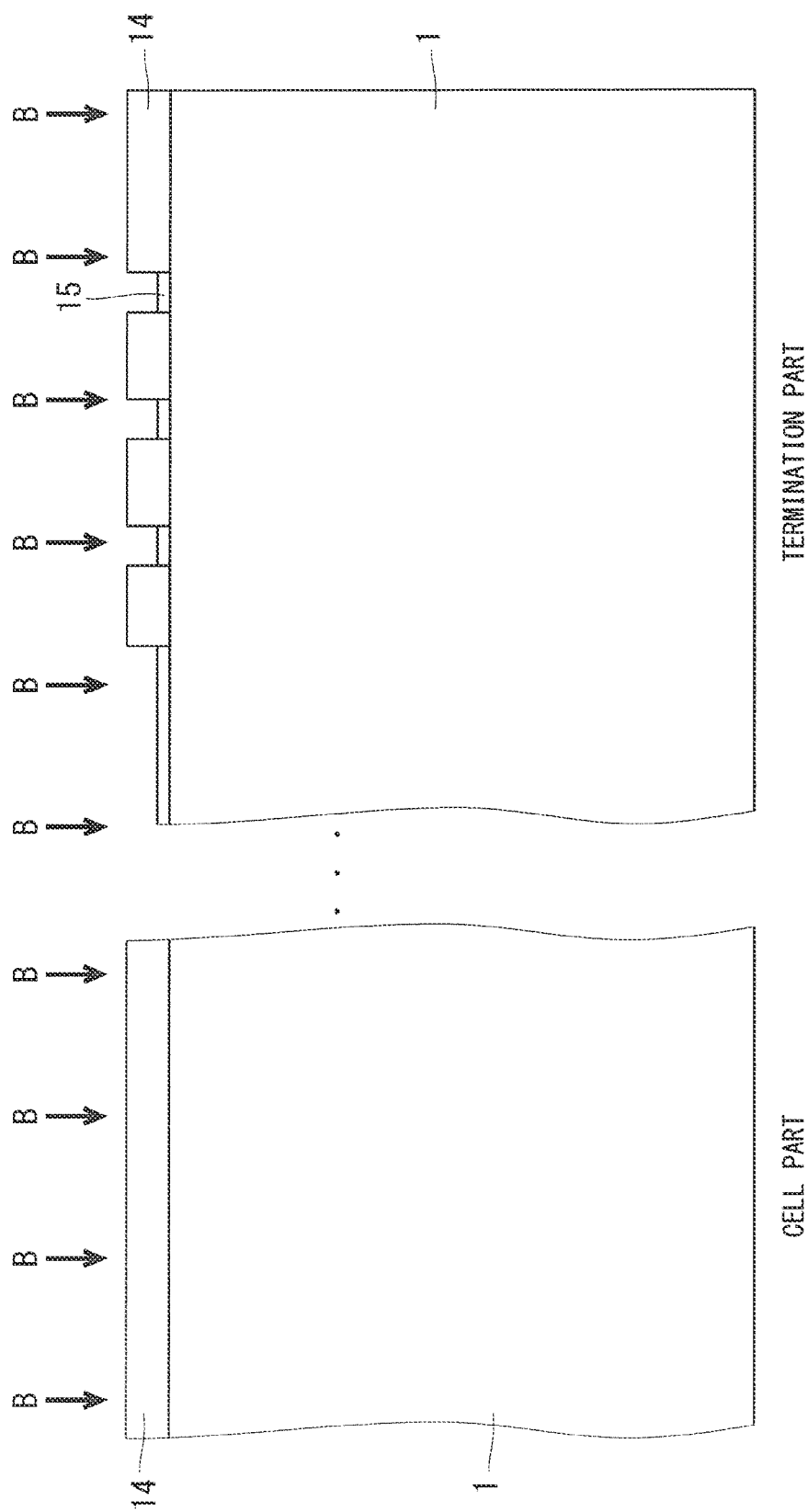
FIG. 5 is a cross-sectional diagram illustrating the manufacturing process of the semiconductor device according to the first embodiment.

Next, as illustrated in FIG. 5, p-type impurities such as boron (B) are ion-implanted into the n-type silicon substrate 1 from the front surface side of the n-type silicon substrate 1. Note that, in the first embodiment, the ion implantation is performed with the thick oxide film 14 being used as a mask. However, the ion implantation may be performed using a resist.

Figure 6:
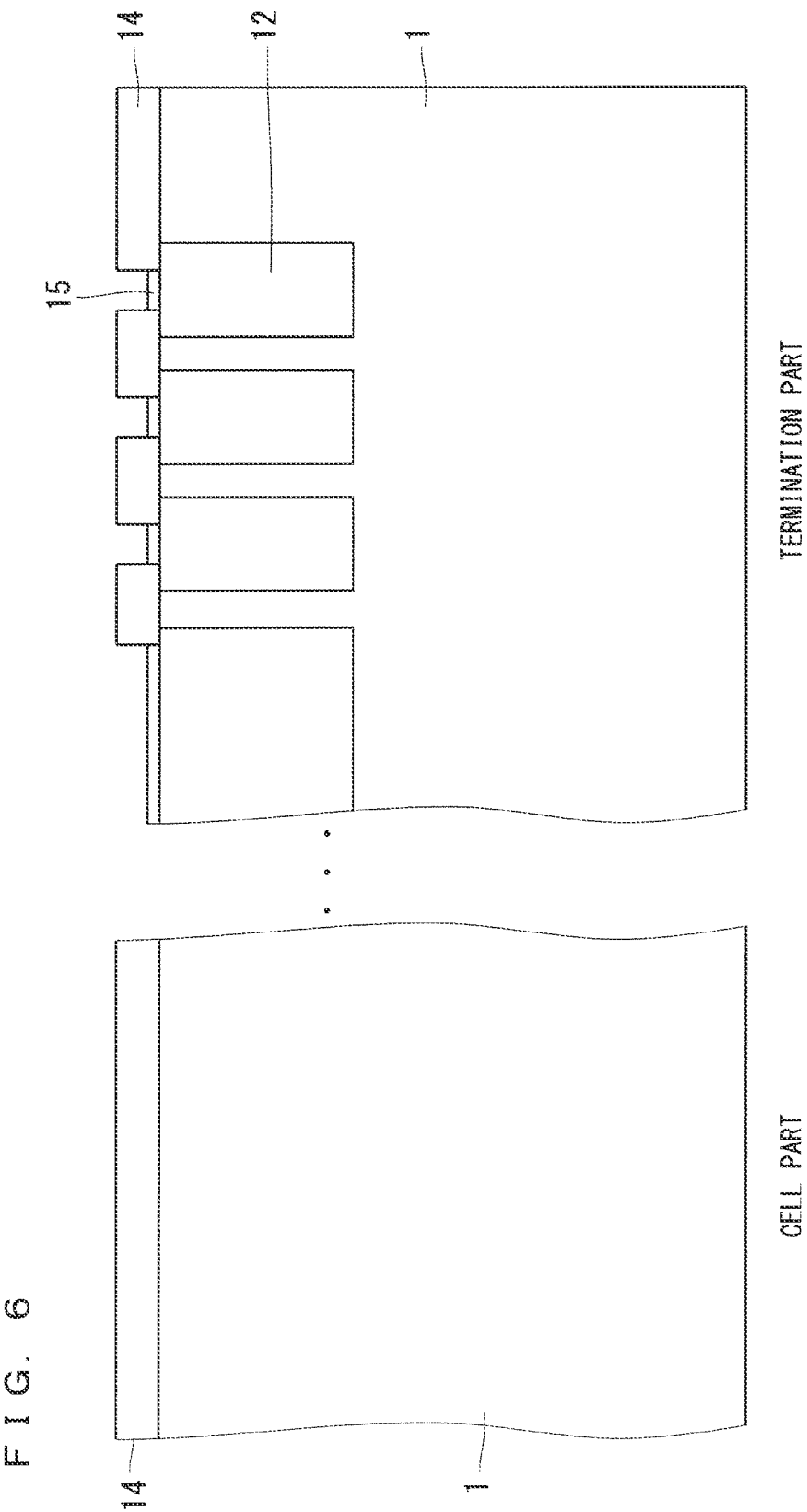
FIG. 6 is a cross-sectional diagram illustrating the manufacturing process of the semiconductor device according to the first embodiment.
Figure 13:
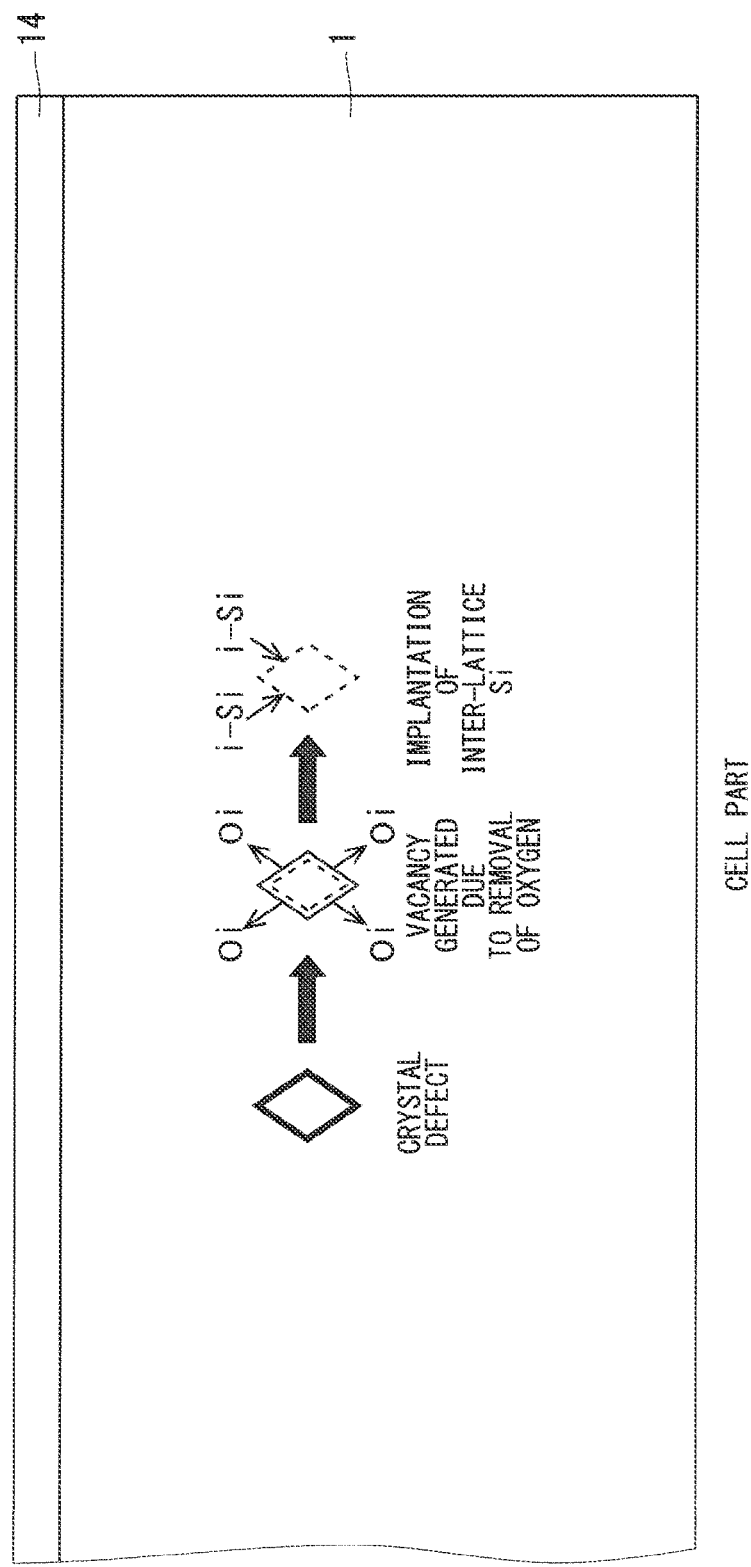
FIG. 13 is a diagram for illustrating disappearance of a crystal defect in the semiconductor device according to the first embodiment.

Next, as illustrated in FIG. 6, thermal treatment is performed at a high temperature of 1000° C. or higher for 240 minutes or longer in a nitrogen atmosphere, so as to form the p well layer 12. Note that it is also possible to perform the thermal treatment while oxidation is performed in an oxygen atmosphere. A mechanism of enhancing the gate breakdown voltage by performing the high-temperature thermal treatment as described above will be described with reference to FIG. 13.

A silicon wafer is manufactured by cutting out a single crystal ingot pulled up by the Czochralski (CZ) method (including the MCZ method). The crystal structure of the single crystal silicon is a diamond structure of a unit lattice including eight silicon atoms, and each of the silicon atoms is bonded to surrounding four silicon atoms with four bonds.

However, in actuality, if the ingot is pulled up at high speed to enhance productivity, homogeneous single crystals cannot be formed, and various crystal defects, such as line defects, dislocations, or densely formed atom vacancies, are caused. Not all of the four bonds of the silicon atoms present around the vacancies, being one of the crystal defects, are used for bonding. Thus, the silicon atoms present around the vacancies form a complex with a large quantity of oxygen included in in the wafer manufactured with the CZ method, and form an oxide film (inner wall oxide film). If there are a larger number of such complexes, an oxide film of satisfactory quality cannot be formed when silicon is oxidized, which thus causes reduction of the breakdown voltage of the oxide film. In particular, in a case of an oxide film that plays an important role for device operation, such as the gate oxide film, reduction of the breakdown voltage of the oxide film causes reduction of reliability of the device. Thus, the quality of the wafer needs to be enhanced and a wafer process needs to be constructed so as to not let adverse effects of the vacancies on the device become obvious.

In the first embodiment, the thermal treatment is performed in a state in which the oxide film 14 is formed without intervals on the front surface of the n-type silicon substrate 1 in the cell part, and thus the vacancies generated due to removal of oxygen can further be reduced in the cell part than in the termination part. Further, because the oxide film 14 is formed without intervals on the front surface of the n-type silicon substrate 1 in the cell part, inter-lattice silicon (also referred to as "inter-lattice Si") is more easily implanted into the vacancies generated in the cell part, and thus the crystal defects can be reduced and the gate breakdown voltage can be enhanced. The thermal treatment is more desirably performed at 1150° C. or higher for 360 minutes or longer. This can further enhance the effects.

Further, in the thermal treatment, the temperature at the time of insertion of a wafer board is approximately 500° C., and the temperature is then gradually raised up to a desired treatment temperature. By setting the rate of temperature rise and temperature fall in this case to 2° C./min or less, slip, being a dislocation defect caused in the wafer, can be forestalled.

In the example of FIG. 6, the underlay oxide film 15 is formed to cover the bottom portions of the openings of the oxide film 14 selectively formed in the termination part; however, because the underlay oxide film 15 has a small thickness, oxygen is removed from the n-type silicon substrate 1 at the time of the thermal treatment, generating more vacancies than in the cell part.

Figure 7:
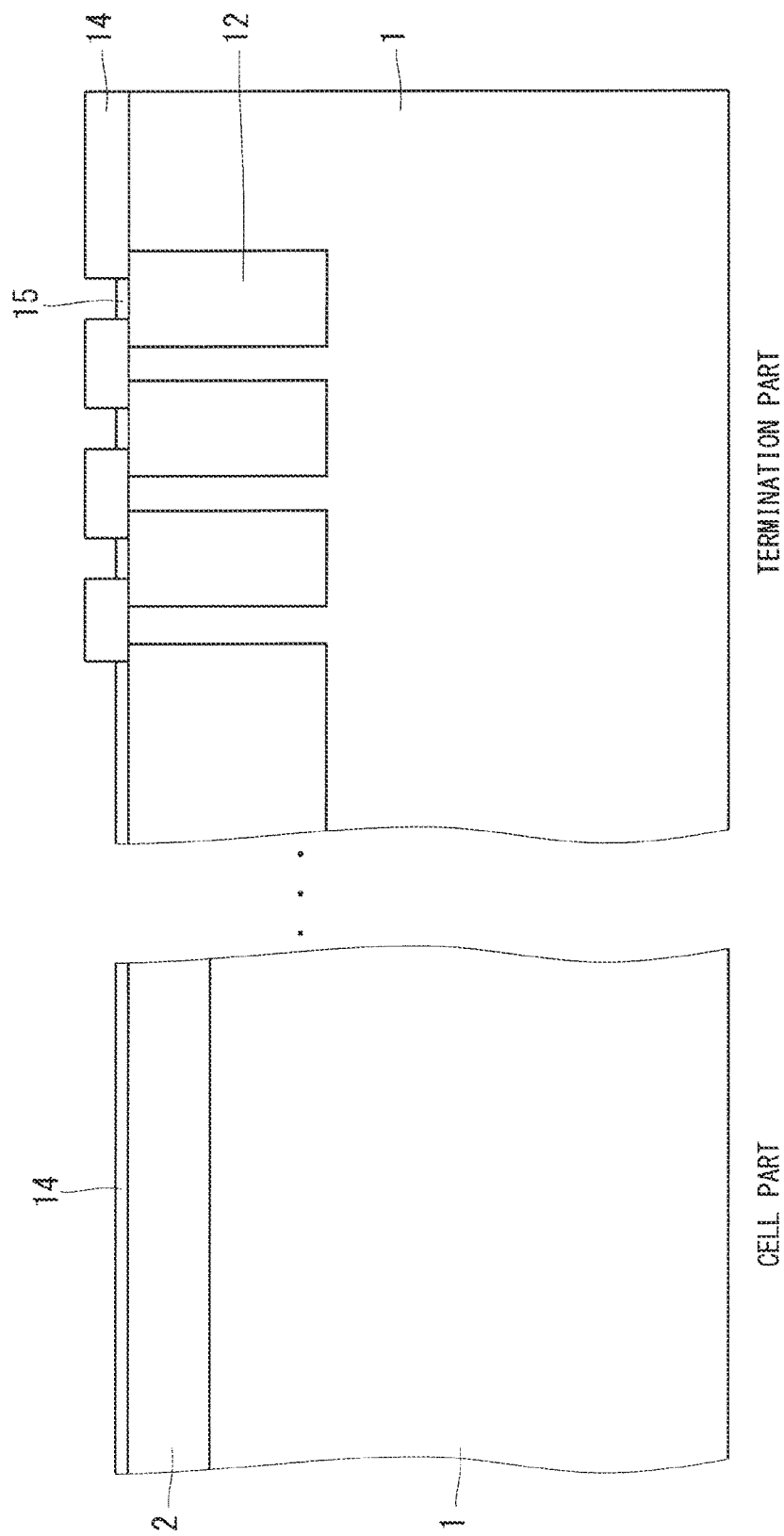
FIG. 7 is a cross-sectional diagram illustrating the manufacturing process of the semiconductor device according to the first embodiment.

The manufacturing method of the semiconductor device is described again. After FIG. 6, as illustrated in FIG. 7, p-type impurities such as boron are ion-implanted into the n-type silicon substrate 1 from the front surface side of the n-type silicon substrate 1 in the cell part, so as to form the p base layer 2. Then, the thermal treatment is performed to activate the p base layer 2.

Figure 8:
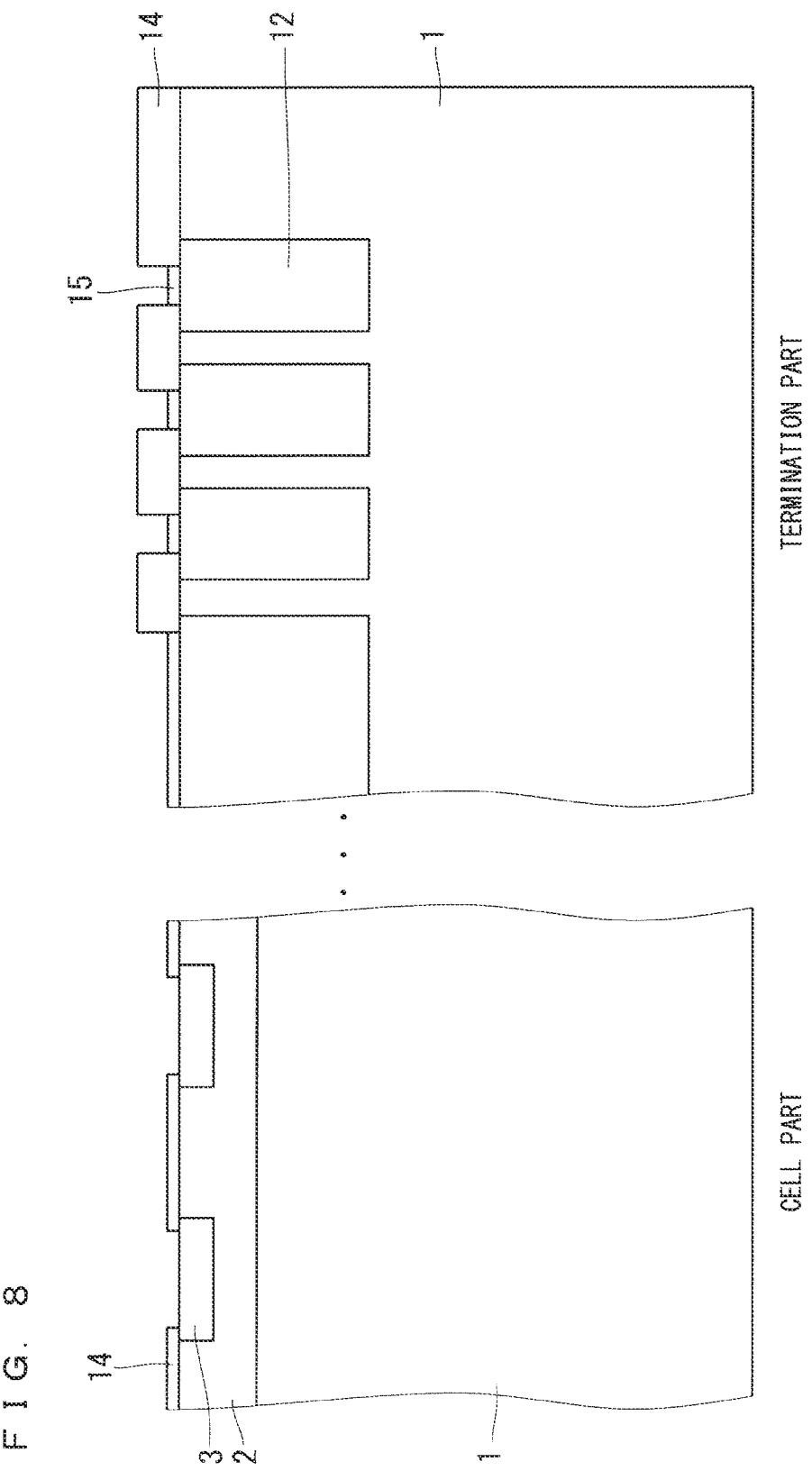
FIG. 8 is a cross-sectional diagram illustrating the manufacturing process of the semiconductor device according to the first embodiment.

Next, as illustrated in FIG. 8, n-type impurities such as phosphorus or arsenic are selectively ion-implanted from the front surface side of the n-type silicon substrate 1 in the cell part, so as to form the n+ emitter layer 3.

Figure 9:
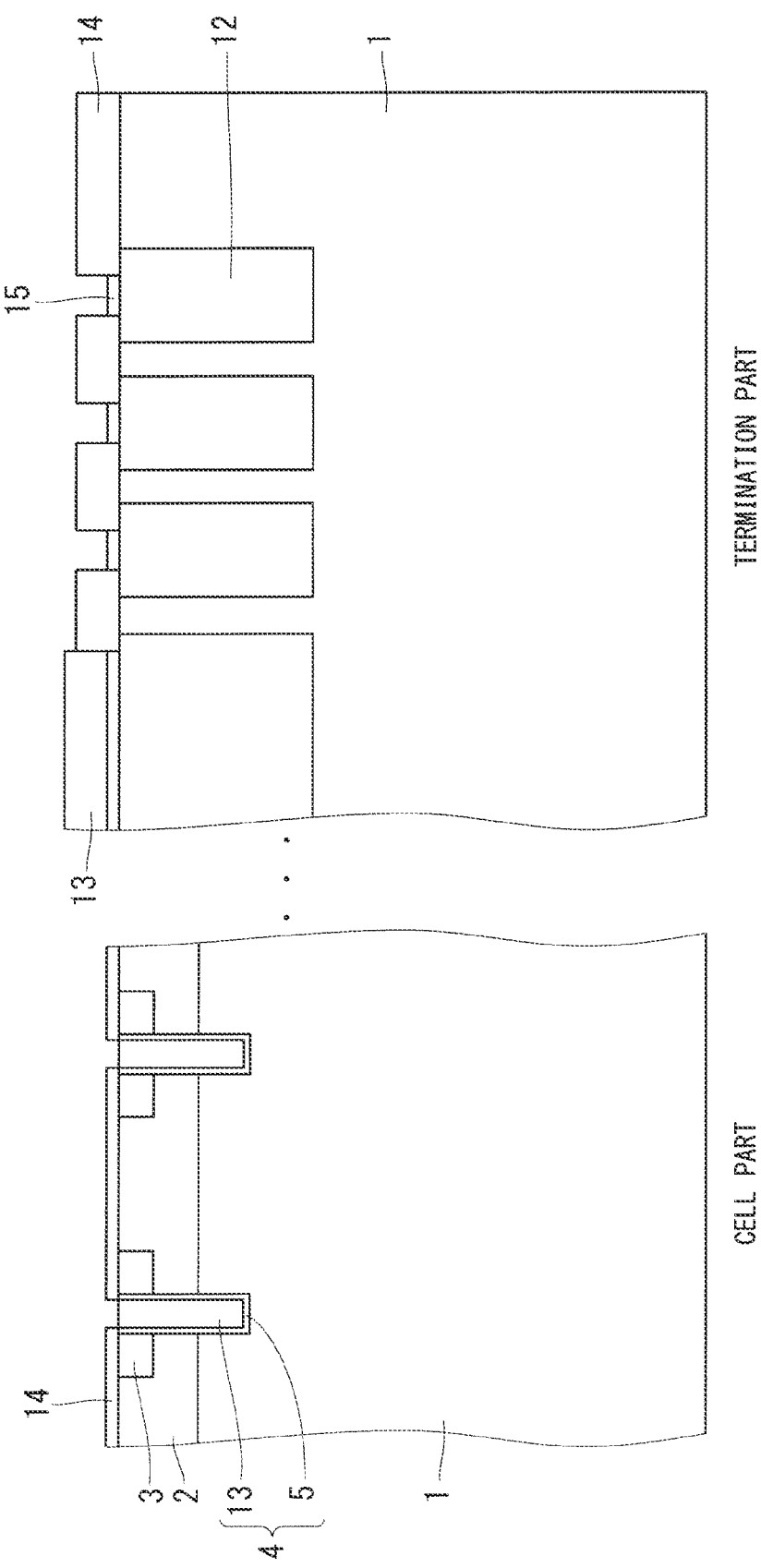
FIG. 9 is a cross-sectional diagram illustrating the manufacturing process of the semiconductor device according to the first embodiment.

Next, as illustrated in FIG. 9, in the cell part, etching is performed to penetrate the n+ emitter layer 3 and the p base layer 2 from the front surface of the n+ emitter layer 3 to reach the drift layer, so as to form a trench. Then, the gate oxide film 5 is formed on the inner wall of the trench, and the polysilicon 13 is filled in the trench via the gate oxide film 5, so as to form the trench gate 4. The polysilicon 13 is also used as gate wiring.

Note that the thermal treatment for enhancing the gate breakdown voltage described in the above can also be performed after the trench is formed through etching. In this case, it is estimated that the crystal defects around the gate oxide film 5 can further be reduced than when the thermal treatment is performed at the timing described in the above (when the thermal treatment is performed in FIG. 6).

Figure 10:
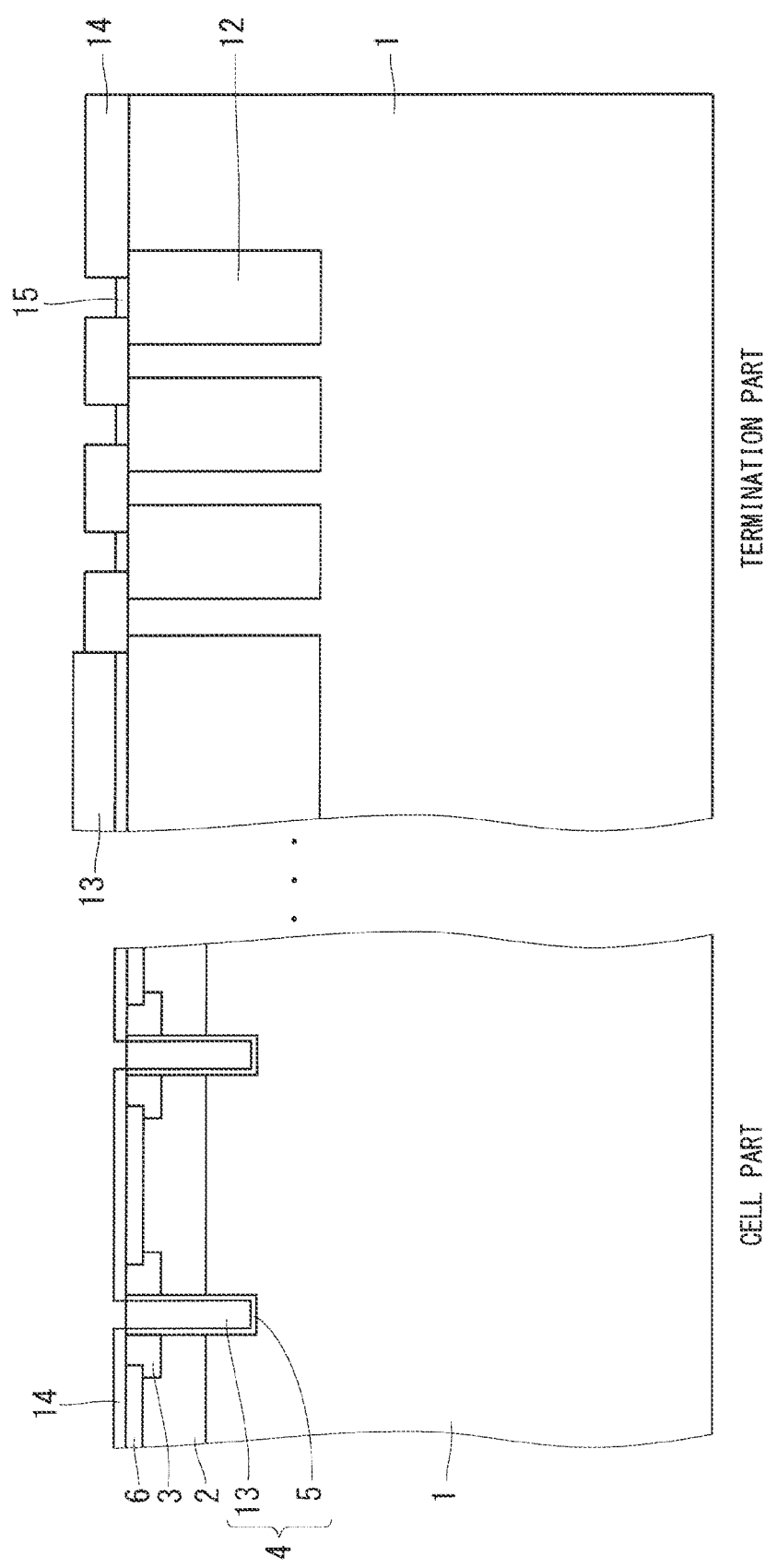
FIG. 10 is a cross-sectional diagram illustrating the manufacturing process of the semiconductor device according to the first embodiment.

Next, as illustrated in FIG. 10, p-type impurities such as boron are ion-implanted into the n-type silicon substrate 1 from the front surface side of the n-type silicon substrate 1 in the cell part, so as to form the p+ layer 6. Then, the thermal treatment is performed to activate the p+ layer 6.

Figure 11:
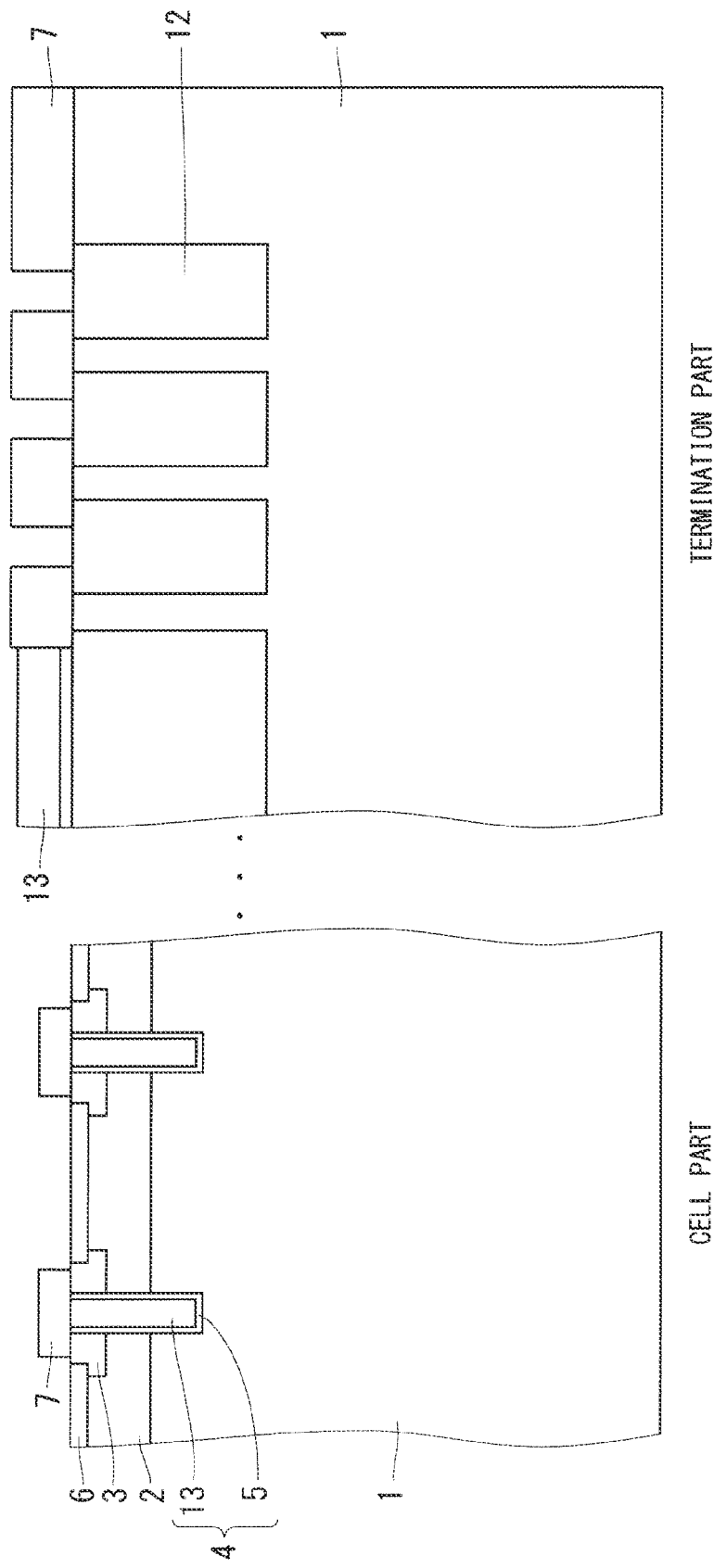
FIG. 11 is a cross-sectional diagram illustrating the manufacturing process of the semiconductor device according to the first embodiment.
Figure 12:
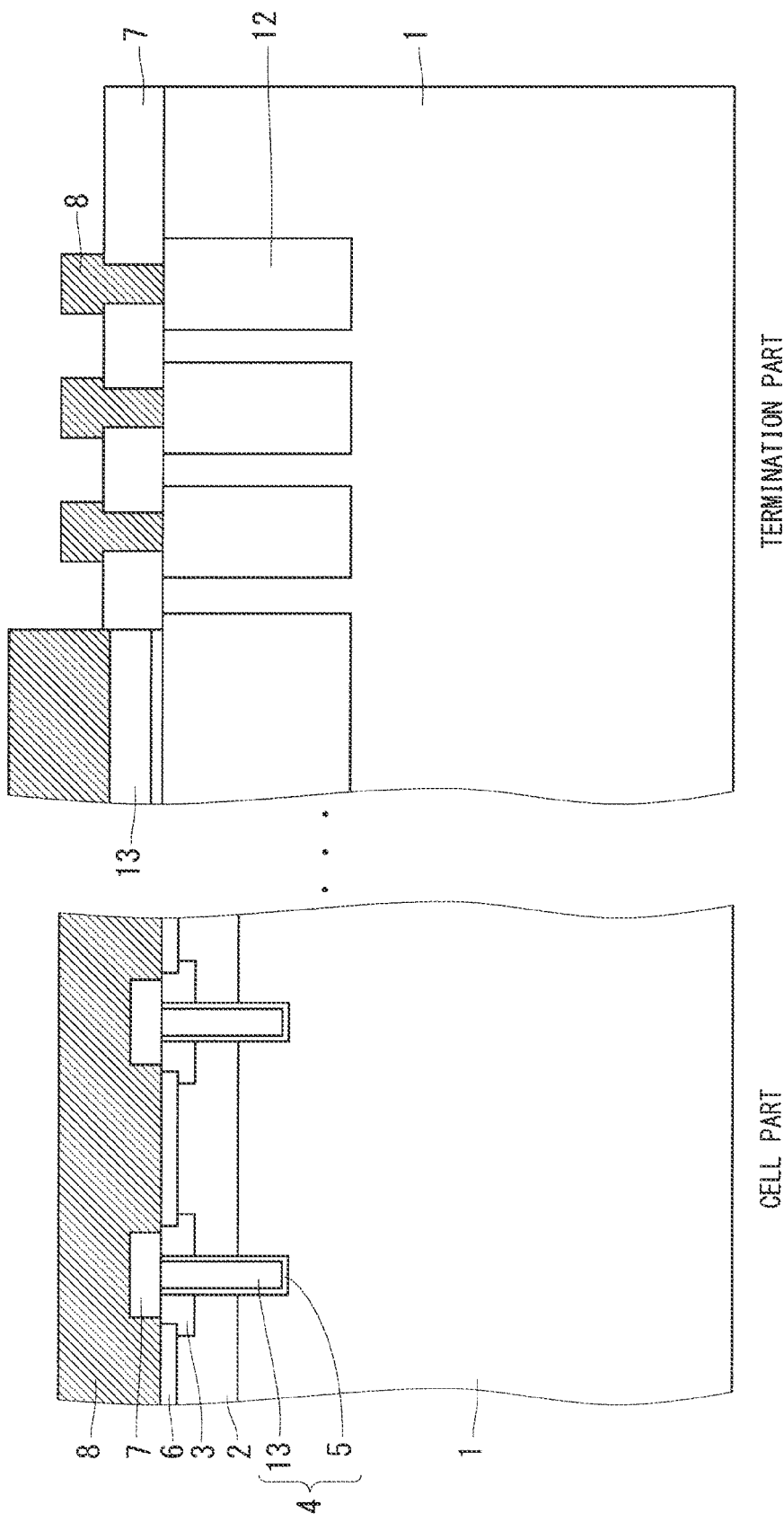
FIG. 12 is a cross-sectional diagram illustrating the manufacturing process of the semiconductor device according to the first embodiment.

Next, as illustrated in FIG. 11, the interlayer insulation film 7 is formed in the cell part and the termination part. Next, as illustrated in FIG. 12, the front surface electrode 8 is formed in the cell part and the termination part. Subsequently, as necessary, a front-surface protective film (not illustrated) of silicon nitride, polyimide, or the like is formed.

Next, treatment on the back surface side of the n-type silicon substrate 1 will be described.

First, the back surface of the n-type silicon substrate 1 is ground until the n-type silicon substrate 1 has a thickness according to the breakdown voltage of the semiconductor device. Subsequently, n-type impurities such as phosphorus or arsenic are ion-implanted from the back surface side of the n-type silicon substrate 1, and annealing is performed to form the buffer layer 9. Similarly, p-type impurities such as boron are ion-implanted, and annealing is performed to form the p collector layer 10. Note that these annealing treatments can be collectively performed at one time, and activation of the n-type and p-type impurities can be simultaneously performed. As a method of annealing, laser annealing or low-temperature furnace annealing is performed so as not to affect the front surface electrode 8.

Subsequently, the back surface electrode 11 is formed. Through the process described above, the semiconductor device according to the first embodiment illustrated in FIG. 1 is manufactured.

<Effects>

At the time of the thermal treatment when the temperature is the highest temperature in a manufacturing process of the semiconductor device according to the first embodiment, the oxide film is formed without intervals in the cell part, and the thermal treatment is performed in a state in which the oxide film is selectively formed in the termination part. The thermal treatment is performed in a state in which the oxide film is formed, so as to assist disappearance of crystal defects caused due to oxygen through implantation of Si into the vacancies from which oxygen is removed (see FIG. 13). Further, in the cell part, the oxide film is formed without intervals, and thus implantation efficiency of Si into the vacancies can be enhanced, which can contribute to enhance of the gate breakdown voltage.

At the time of the thermal treatment, the oxide film is formed without intervals in the cell part, and the oxide film is selectively formed in the termination part. Accordingly, density of the vacancies in the surface layer in the cell part is lower than that in the termination part.

By performing the thermal treatment at 1000° C. or higher for 240 minutes or longer, more desirably at 1150° C. or higher for 360 minutes or longer, crystal defects caused due to oxygen can be reduced. Further, by performing the thermal treatment at 1000° C. or higher for 240 minutes or longer, more desirably at 1150° C. or higher for 360 minutes or longer, oxygen concentration on the front surface side of the n-type silicon substrate 1 can be reduced.

From the above, according to the first embodiment, by enhancing implantation efficiency of Si into the vacancies generated in the cell part, the gate breakdown voltage can be more easily enhanced than in related art.

Second Embodiment

As described in the first embodiment, in order to reduce crystal defects, the following three aspects are important: reducing oxygen concentration included in the wafer that may form crystal defects; performing high-temperature thermal treatment to remove the inner wall oxide film bonded to the crystal defects; and efficiently supplying inter-lattice silicon into a bulk.

In the manufacturing process of the semiconductor device, in order to maintain the breakdown voltage, the thermal treatment is performed at 1150° C. or higher for 360 minutes or longer when the deep p well layer 12 is formed in the termination part. In this case, it is effective to leave the oxide film 14 formed in the cell part thick to have oxygen diffuse.

Figure 14:
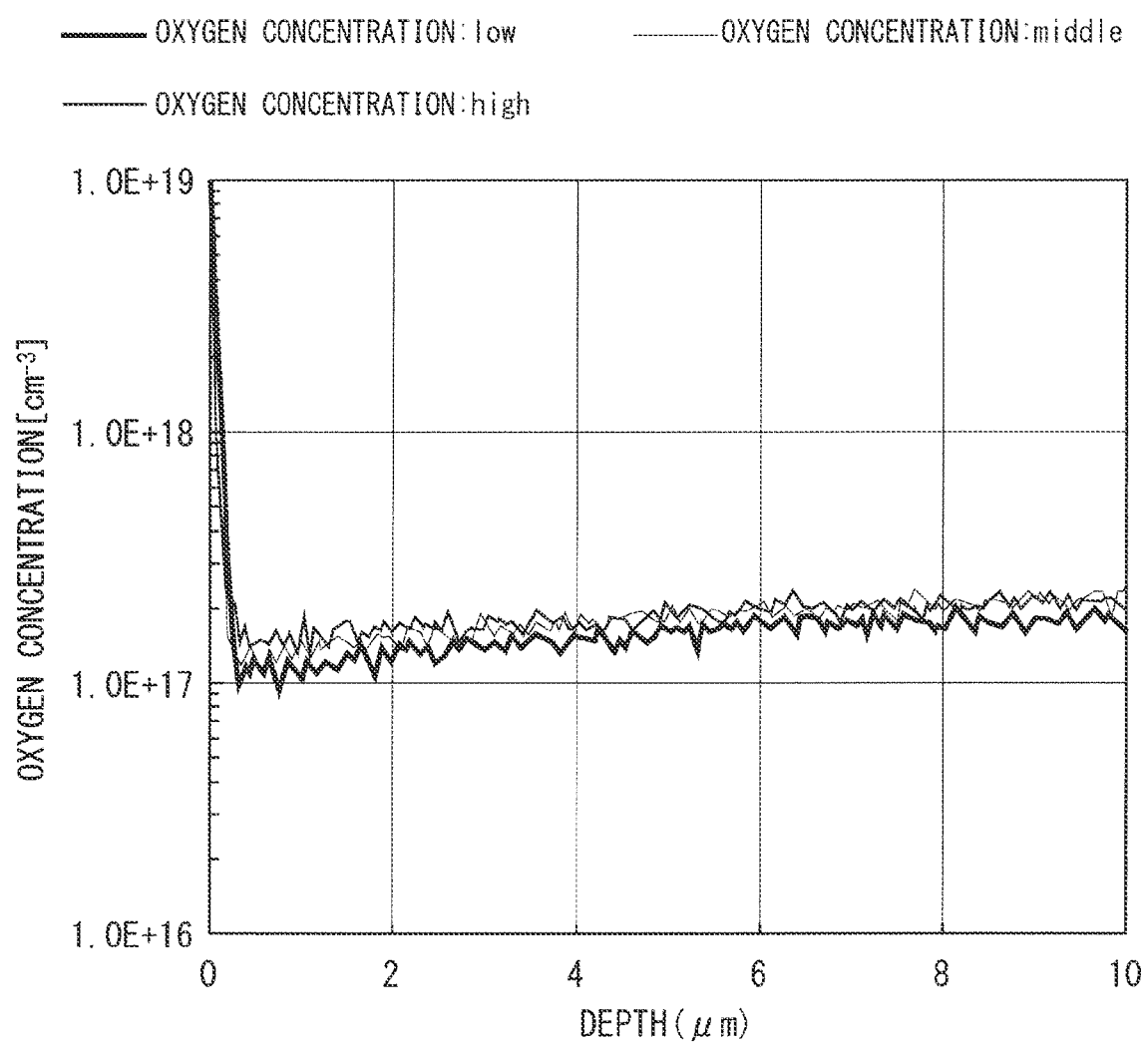
FIG. 14 is a graph showing a relationship between depth from a front surface and oxygen concentration after completion of a wafer process of the semiconductor device according to the second embodiment.

FIG. 14 is a graph showing a relationship between depth from the front surface and oxygen concentration after completion of the wafer process of the semiconductor device according to the second embodiment. The depth in the horizontal axis represents the depth from the front surface of the n-type silicon substrate 1. Further, "OXYGEN CONCENTRATION: low" indicates that the initial oxygen concentration included in the wafer before start of the wafer process is low, "OXYGEN CONCENTRATION: middle" indicates that the initial oxygen concentration included in the wafer before start of the wafer process is middle, and "OXYGEN CONCENTRATION: high" indicates that the initial oxygen concentration included in the wafer before start of the wafer process is high. Note that the configuration and the manufacturing method of the semiconductor device according to the second embodiment are the same as those of the first embodiment.

As illustrated in FIG. 14, oxygen is released from the front surface side through outward diffusion, and thus oxygen concentration on the front surface side is low. The reason why oxygen concentration is high on the most front surface is because the oxide film is formed on the front surface.

Figure 15:
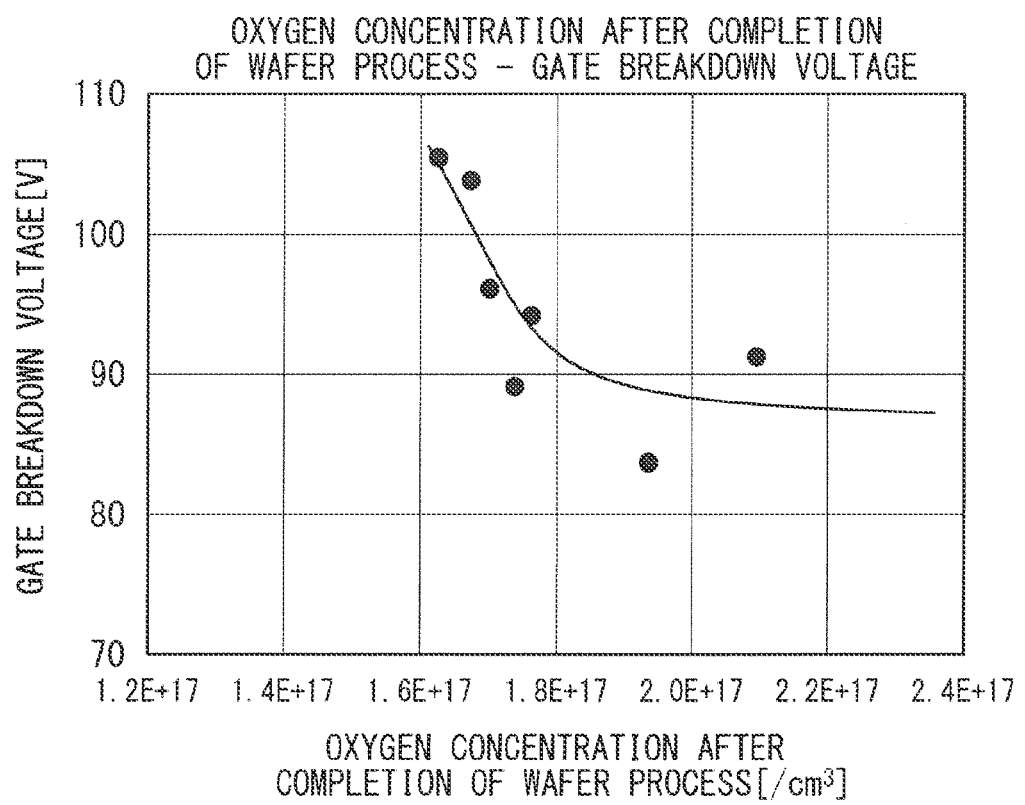
FIG. 15 is a graph showing a relationship between oxygen concentration and a gate breakdown voltage after completion of the wafer process of the semiconductor device according to the second embodiment.

FIG. 15 is a graph showing a relationship between oxygen concentration and the gate breakdown voltage after completion of the wafer process of the semiconductor device according to the second embodiment. In the IGBT, the trench is formed to have a depth of approximately 3 to 8 μm, and thus FIG. 15 shows a relationship between the oxygen concentration and the gate breakdown voltage when the depth is 8 μm.

Generally, in the IGBT, the breakdown voltage between the p collector layer 10 and the n+ emitter layer 3 is 600 V or higher, and the thickness of a gate insulation film formed in the inner wall of the trench is approximately 1000 to 1200 Å. As described above, according to the present disclosure, by reducing oxygen concentration, a high gate breakdown voltage can be secured, and thus the thickness of the gate oxide film 5 can be reduced down to approximately 600 Å. Specifically, the thickness of the gate oxide film 5 can be made approximately 600 to 1200 Å. In this manner, energization ability can be enhanced, and turn-on losses can be reduced.

Further, by setting the oxygen concentration to $1.8E17/cm^3$ or less, the gate breakdown voltage can be improved. Specifically, when the depth from the front surface of the trench gate 4 is represented by D1, the oxygen concentration when the depth from the front surface is less than D1 in the cell part is $1.8E17/cm^3$ or less.

Figure 16:
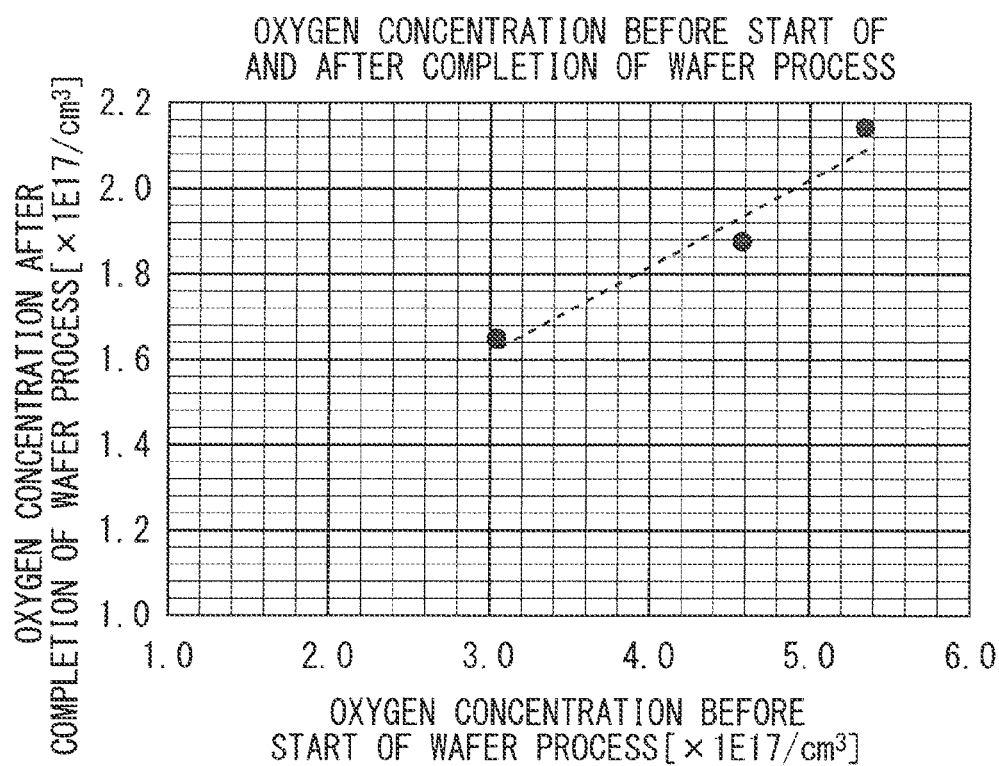
FIG. 16 is a graph showing a relationship between oxygen concentration before start of the wafer process and after completion of the wafer process of the semiconductor device according to the second embodiment.

As described in the first embodiment, after the structure on the front surface side of the n-type silicon substrate 1 is formed, the back surface side of the n-type silicon substrate 1 is ground, so as to form the diffusion layer and the like. The part where oxygen is released through the thermal treatment on the front surface is approximately 50 μm from the front surface of the n-type silicon substrate 1 in the depth direction. When the initial thickness of the wafer is 700 to 800 μm, and the breakdown voltage of the IGBT is set to 600 to 6500 V, the final thickness of the wafer is 60 to 650 μm, and the wafer is ground by 50 μm or more through the grinding on the back surface side. This makes the oxygen concentration on the collector side equal to the initial oxygen concentration of the wafer. From a correlation between the initial oxygen concentration of the wafer and the oxygen concentration after completion of the wafer process shown in FIG. 16, when the oxygen concentration on the front surface side is $1.8E17/cm^3$, oxygen of $4.0E17/cm^3$ is included on the collector side.

Note that, in the present disclosure, each embodiment can be freely combined, and each embodiment can be modified or omitted as appropriate within the scope of the invention.

While the disclosure has been shown and described in detail, the foregoing description is in all aspects illustrative and not restrictive. It is therefore understood that numerous modifications and variations can be devised.

What is claimed is:

1. A semiconductor device comprising:
   a silicon substrate of a first conductivity type including a cell part and a termination part surrounding the cell part in plan view;
   an emitter layer of the first conductivity type provided on a front surface of the silicon substrate in the cell part;
   a collector layer of a second conductivity type provided on a back surface of the silicon substrate in the cell part;
   a drift layer of the first conductivity type provided between the emitter layer and the collector layer;
   a trench gate provided to reach the drift layer from a front surface of the emitter layer; and
   a well layer of the second conductivity type provided on the front surface of the silicon substrate in the termination part, wherein
   vacancies included in a crystal defect in the cell part are less than vacancies included in a crystal defect in the termination part.

2. The semiconductor device according to claim 1, wherein
   inter-lattice silicon in the cell part is more than inter-lattice silicon in the termination part.

3. The semiconductor device according to claim 1, wherein
   depth from a front surface of the trench gate is D1, and
   oxygen concentration when the depth from the front surface is less than the D1 in the cell part is $1.8E17/cm^3$ or less.

4. The semiconductor device according to claim 3, wherein
   the D1 is 3 to 8 μm.

5. The semiconductor device according to claim 1, wherein
   oxygen concentration of the collector layer is $4.0E17/cm^3$ or less.

6. The semiconductor device according to claim 1, wherein
   oxygen concentration of the drift layer is equal to the oxygen concentration of the collector layer.

7. The semiconductor device according to claim 1, further comprising
   a gate oxide film provided in an inner wall of the trench gate, wherein
   a breakdown voltage between the collector layer and the emitter layer is 600 V or higher, and thickness of the gate oxide film is 600 to 1200 Å.

* * * * *